(12) United States Patent
Wang et al.

(10) Patent No.: US 10,529,758 B2
(45) Date of Patent: Jan. 7, 2020

(54) PACKAGING METHOD AND PACKAGING STRUCTURE

(71) Applicant: China Wafer Level CSP Co., Ltd., Suzhou, Jiangsu (CN)

(72) Inventors: Zhiqi Wang, Jiangsu (CN); Qiong Yu, Suzhou (CN); Wei Wang, Suzhou (CN)

(73) Assignee: China Wafer Level CSP Co., Ltd., Suzhou, Jiangsu (CN)

(*) Notice: Subject to any disclaimer, the term of this patent is extended or adjusted under 35 U.S.C. 154(b) by 0 days.

(21) Appl. No.: 15/549,987

(22) PCT Filed: Sep. 21, 2015

(86) PCT No.: PCT/CN2015/090085
§ 371 (c)(1),
(2) Date: Aug. 9, 2017

(87) PCT Pub. No.: WO2016/127645
PCT Pub. Date: Aug. 18, 2016

(65) Prior Publication Data
US 2018/0047772 A1 Feb. 15, 2018

(30) Foreign Application Priority Data
Feb. 13, 2015 (CN) .......................... 2015 1 0079349

(51) Int. Cl.
*H01L 27/146* (2006.01)
*H01L 21/768* (2006.01)
*H01L 21/78* (2006.01)

(52) U.S. Cl.
CPC .. *H01L 27/14618* (2013.01); *H01L 21/76898* (2013.01); *H01L 21/78* (2013.01);
(Continued)

(58) Field of Classification Search
CPC ............. H01L 27/14618; H01L 23/481; H01L 27/14698; H01L 27/14636; H01L 21/78;
(Continued)

(56) References Cited

U.S. PATENT DOCUMENTS

2003/0124762 A1  7/2003  Hashimoto
2007/0054419 A1* 3/2007  Paik .................. H01L 27/14618
                                                            438/1
(Continued)

FOREIGN PATENT DOCUMENTS

CN         1428868 A    7/2003
CN       101569012 A   10/2009
(Continued)

OTHER PUBLICATIONS

PCT/CN2015/090085, dated Dec. 1, 2015, International Search Report.
(Continued)

*Primary Examiner* — Julia Slutsker
(74) *Attorney, Agent, or Firm* — Wolf, Greenfield & Sacks, P.C.

(57) ABSTRACT

A method for forming an image sensor package and an image sensor package are provided. The method includes: providing a first substrate and a second substrate which includes a first surface and a second surface opposite to the first surface, and attaching either surface of the first substrate with the first surface of the second substrate with an adhesive layer; forming a groove at the second surface of the second substrate; providing a base which includes a first surface and a second surface opposite to the first surface, where the first surface of the base is provided with a sensing region and multiple contact pads; and attaching the second surface of the second substrate with the first surface of the
(Continued)

base, where a cavity is formed between the groove and the base, and the sensing region is located within the cavity.

9 Claims, 7 Drawing Sheets

(52) U.S. Cl.
CPC .. *H01L 27/14636* (2013.01); *H01L 27/14685* (2013.01); *H01L 27/14698* (2013.01)
(58) Field of Classification Search
CPC ......... H01L 21/76898; H01L 27/14685; H01L 27/146; H01L 2924/16235; H01L 2224/11
See application file for complete search history.

(56) References Cited

U.S. PATENT DOCUMENTS

| | | | |
|---|---|---|---|
| 2009/0152658 A1 | 6/2009 | Bolken et al. | |
| 2010/0003779 A1* | 1/2010 | Watanabe | H01L 27/14632 438/64 |
| 2011/0189808 A1* | 8/2011 | Watanabe | H01L 27/14618 438/66 |
| 2012/0148186 A1 | 6/2012 | Vigier-Blanc | |
| 2013/0127000 A1 | 5/2013 | Oganesian | |

FOREIGN PATENT DOCUMENTS

| | | |
|---|---|---|
| CN | 102150269 A | 8/2011 |
| CN | 102610624 A | 7/2012 |
| CN | 102623471 A | 8/2012 |
| CN | 202523711 A | 11/2012 |
| CN | 103137632 A | 6/2013 |
| CN | 103904093 A | 7/2014 |
| CN | 203967091 A | 11/2014 |
| CN | 104637967 A | 5/2015 |
| CN | 204497233 A | 7/2015 |
| JP | 2007-073958 A | 3/2007 |
| JP | 2008-166585 A | 7/2008 |
| JP | 2009-164314 A | 7/2009 |
| JP | 2010-067836 A | 3/2010 |

OTHER PUBLICATIONS

International Search Report for Application No. PCT/CN2015/090085 dated Dec. 1, 2015.
JP 2017-542891, dated Jun. 12, 2018, Japanese 1st Office Action.
Japanese 1st Office Action dated Jun. 12, 2018 in connection with Application No. 2017-542891.

* cited by examiner

PACKAGING METHOD AND PACKAGING STRUCTURE

This application is the national phase of International Application No. PCT/CN2015/090085, titled "PACKAGING METHOD AND PACKAGING STRUCTURE", filed on Sep. 21, 2015, which claims priority to Chinese Patent Application No. 201510079349.3, titled "PACKAGING METHOD AND PACKAGING STRUCTURE", filed with the Chinese State Intellectual Property Office on Feb. 13, 2015, both of which are incorporated herein by reference in their entireties.

FIELD

The present disclosure relates to the technical field of semiconductors, and particularly to a wafer-level packaging method and a wafer-level packaging structure for an image sensing chip.

BACKGROUND

The wafer level chip size packaging (WLCSP) technology is a technology where a full wafer is packaged and tested, and then is cut to acquire individual finished chip packages, the packaged chip package being the same size as a die.

The wafer level chip size packaging technology changes the conventional packaging manners such as the packaging manner of the ceramic leadless chip carrier, the packaging manner of the organic leadless chip carrier and the packaging manner of the digital camera module, and meets the increasing market demand for lighter, smaller, shorter, thinner and lower-priced microelectronic products. A chip packaged using the wafer level chip size packaging technology is highly miniaturized, and the cost of the chip is dramatically reduced with a decrease in the chip size and an increase in the wafer size. The wafer level chip size packaging technology combines IC design, wafer fabrication, package test, and substrate fabrication together, and is an on-going concern as well as a future development trend in the current packaging field.

In the wafer level packaging technology, especially in the case of packaging an image sensing chip, an upper cover substrate is generally covered on a surface of the semiconductor wafer on which devices are formed, in order to protect the devices from damage and pollution during packaging.

Reference is made to FIG. 1, which is a schematic cross-sectional structural diagram of a wafer level chip packaging structure. The wafer level chip packaging structure includes: a substrate 10, where a sensing region 20 is formed on the substrate 10, contact pads 21 are formed on the substrate 10 on two sides of the sensing device, a through hole is formed on another surface of the substrate 10 which is opposite to the sensing region 20, the contact pad 21 is exposed by the through hole, an insulation layer 11 is formed on a sidewall of the through hole and the surface of the substrate 10, a line layer 12 is formed on the surface of the contact pad 21 and a part of a surface of the insulation layer 11, the line layer 12 and the insulation layer 11 are covered by a solder mask 13 having an opening, and a solder ball 14 which is connected with the line layer 12 is disposed at the opening.

The surface of the substrate 10 provided with the sensing region 20 is covered by an upper cover substrate 30. A cavity wall 31 is disposed between the upper cover substrate 30 and the surface of the substrate 10. A cavity is formed between the cavity wall 31, the upper cover substrate 30 and the substrate 10, and the sensing region 20 is located in the cavity to protect the device from pollution and damage.

The upper cover substrate 30 generally has a relatively great thickness, which is generally around 400 μm, in order to meet process requirements. Therefore, the thickness of a chip package formed by cutting a packaged wafer is great, and the overall thickness of a subsequent module on the chip package is great as well, which cannot meet the market demand for thinner electronic products.

To reduce the thickness of the wafer package, the upper cover substrate on the surface of the packaged wafer is removed (as shown in FIG. 2) to expose the sensing region 20. In this case, although the thickness of the wafer package is reduced, the overall performance of the packaging structure is affected since the sensing region 20 is vulnerable to pollution and damage.

Therefore, there is a need for a packaging method which can reduce the thickness of the packaging structure without affecting the performance of the packaging structure.

SUMMARY

The objective of the present disclosure is to provide a packaging method and a packaging structure to reduce the thickness of the packaging structure.

In an aspect, a packaging method is provided. The packaging method includes: providing a first substrate and a second substrate, where the second substrate includes a first surface and a second surface opposite to the first surface, and attaching either surface of the first substrate with the first surface of the second substrate with an adhesive layer; forming a groove structure at the second surface of the second substrate; providing a base, where the base includes a first surface and a second surface opposite to the first surface, and the first surface of the base is provided with a sensing region and multiple contact pads located around the sensing region; and attaching the second surface of the second substrate with the first surface of the base, where a cavity is formed between the groove structure and the base, and the sensing region is located within the cavity.

Optionally, after attaching the second surface of the second substrate with the first surface of the base, the method may further include: performing a packaging process on the second surface of the base; and removing the first substrate and the adhesive layer.

Optionally, the packaging process performed on the second surface of the base may include: thinning and etching the second surface of the base to form a through hole, where a part of a surface of the contact pad is exposed at a bottom of the through hole; forming an insulation layer on the second surface of the base and a sidewall surface of the through hole; forming a metal layer on a surface of the insulation layer, where the metal layer is connected with the contact pad; forming a solder mask having an opening on a surface of the metal layer and the surface of the insulation layer, where a part of the surface of the metal layer is exposed by the opening; and forming a protrusion for external connection on the surface of the metal layer.

Optionally, the through hole may be filled with the metal layer, and the surface of the metal layer may be flush with the second surface of the base; the top surface of the metal layer may be exposed by the opening in the solder mask; and a protrusion for external connection may be formed in the opening, where the protrusion for external connection is connected with the top surface of the metal layer.

Optionally, the first substrate may have a thickness of 300 μm to 500 μm.

Optionally, the second substrate may have a thickness of 100 μm to 200 μm.

Optionally, the attaching the surface of the first substrate with the first surface of the second substrate with the adhesive layer may include: forming the adhesive layer on the surface of the first substrate, and attaching the first surface of the second substrate with the adhesive layer; or forming the adhesive layer on the first surface of the second substrate, and attaching the surface of the first substrate with the adhesive layer.

Optionally, the adhesive layer may include a first adhesive layer and a second adhesive layer.

Optionally, the attaching the surface of the first substrate with the first surface of the second substrate with the adhesive layer may include: forming the first adhesive layer on the surface of the first substrate and forming the second adhesive layer on the first surface of the second substrate, or forming the second adhesive layer on the surface of the first substrate and forming the first adhesive layer on the first surface of the second substrate; and attaching the first substrate with the second substrate with the first adhesive layer and the second adhesive layer.

Optionally, the adhesive layer may be formed by a spraying process, a spin coating process or an adhesion process.

In a case where the first adhesive layer is an adhesive layer which is decomposable under laser irradiation, the adhesive layer is irradiated by laser to cause the adhesive layer to lose adhesiveness, to remove the first substrate; and in a case where the adhesive layer is a thermally decomposable adhesive layer, the adhesive layer is processed using a thermal decomposition method, to cause the adhesive layer to lose adhesiveness, to remove the first substrate.

Optionally, the surface of the second substrate may be cleaned to remove the adhesive layer on the surface of the second substrate.

Optionally, the forming the groove structure may include: forming a cavity wall material layer on the second surface of the second substrate, and etching the cavity wall material layer to the surface of the second substrate to form a groove in the cavity wall material layer; or etching the second surface of the second substrate to form a groove in the second substrate.

Optionally, the base may include multiple units, a sensing region and multiple contact pads located around the sensing region may be formed on each of the multiple units, sawing lanes may be provided between adjacent units, the groove structure formed on a surface of the second substrate other than the surface attached with the first substrate may include multiple grooves which have a one-to-one correspondence with multiple sensing regions on the multiple units; and the method may further include: cutting the base and the first substrate along the sawing lanes after the first substrate and the adhesive layer is removed, to form multiple chip packages.

In another aspect, a packaging structure is provided according to the embodiments of the present disclosure. The packaging structure includes: a first substrate and a second substrate, where the second substrate includes a first surface and a second surface opposite to the first surface, and either surface of the first substrate is attached with the first surface of the second substrate with an adhesive layer; a groove structure located at the second surface of the second substrate; and a base, where the base includes a first surface and a second surface opposite to the first surface, and the first surface of the base is provided with a sensing region and multiple contact pads located around the sensing region, where the second surface of the second substrate is attached with the first surface of the base, a cavity is formed between the groove structure and the base, and the sensing region is located in the cavity.

Optionally, a material of the first substrate may be glass, a silicon wafer, ceramic or plastic.

Optionally, the first substrate may have a thickness of 300 μm to 500 μm.

Optionally, a material of the second substrate may be a transparent material.

Optionally, the second substrate may have a thickness of 100 μm to 200 μm.

Optionally, the adhesive layer may include a first adhesive layer and a second adhesive layer.

Optionally, the first adhesive layer is located on the surface of the first substrate, and the second adhesive layer is located on the first surface of the second substrate; or the second adhesive layer is located on the surface of the first substrate surface, and the first adhesive layer is located on the first surface of the second substrate.

Optionally, the adhesive layer may be an adhesive layer which is decomposable under laser irradiation; or the adhesive layer may be a thermally decomposable adhesive layer.

Optionally, the groove structure may include: a groove in a cavity wall material layer on the second surface of the second substrate; or a groove in the second surface of the second substrate.

Optionally, the base may include multiple units, a sensing region and multiple contact pads located around the sensing region may be formed on each of the multiple units, sawing lanes may be provided between adjacent units, the groove structure formed on a surface of the second substrate other than the surface attached with the first substrate may include multiple grooves which have a one-to-one correspondence with multiple sensing regions on the multiple units Optionally, the packaging structure may further include: a through hole in the second surface of the base, where a part of a surface of the contact pad is exposed at a bottom of the through hole; an insulation layer on the second surface of the base and a sidewall surface of the through hole; a metal layer on a surface of the insulation layer, where the metal layer is connected with the contact pad; a solder mask having an opening on a surface of the metal layer and the surface of the insulation layer, where a part of the surface of the metal layer is exposed by the opening; and a protrusion for external connection on the surface of the metal layer.

Optionally, the through hole may be filled with the metal layer, and the surface of the metal layer may be flush with a surface of the insulation layer; the top surface of a metal layer is exposed by the opening in the solder mask, and a protrusion for external connection is formed in the opening, where the protrusion for external connection is connected with the top surface of the metal layer.

In another aspect, a packaging structure is provided according to the embodiments of the present disclosure. The packaging structure includes: a substrate, where the substrate includes a first surface and a second surface opposite to the first surface; a groove structure located at the second surface of the substrate; and a base, where the base includes a first surface and a second surface opposite to the first surface, and the first surface of the base is provided with a sensing region and multiple contact pads located around the sensing region, where the second surface of the substrate is attached with the first surface of the base, a cavity is formed between the groove structure and the base, and the sensing region is located in the cavity; and the substrate has a thickness of 100 μm to 200 μm.

In the packaging method and the packaging structure formed using the packaging method provided according to the embodiments of the present disclosure, the packaging structure includes: a first substrate and a second substrate, where a surface of the first substrate is attached with a first surface of the second substrate with an adhesive layer; and a groove structure located at a second surface of the second substrate, where the second surface of the second substrate is attached with a first surface of a base, a cavity is formed between the groove structure and the base, such that the sensing region on the base is located in the cavity. The two-layered upper cover substrate structure constituted by the first substrate and the second substrate facilitates subsequent removing of the first substrate to reduce the thickness of the formed package structure. Therefore, it is unnecessary to use an etching or grinding process to reduce the thickness of the upper cover substrate, thus the smoothness of the retained second substrate which is capable of protecting the sensing region can be ensured while the thickness of the package structure can be reduced.

BRIEF DESCRIPTION OF THE DRAWINGS

The drawings to be used in the description of the embodiments or the conventional technology will be described briefly as follows, so that the technical solutions according to the embodiments of the present disclosure or according to the conventional technology will become clearer. It is apparent that the drawings in the following description only illustrate some embodiments of the present disclosure. For those skilled in the art, other drawings may be obtained according to these drawings without any creative work.

DETAILED DESCRIPTION OF EMBODIMENTS

As described in BACKGROUND, the upper cover substrate of the packaging structure has a great thickness, which cannot meet the increasing market demand for thinner electronic products. In addition, for a packaging structure provided with an optical sensing unit, the upper cover substrate of the packaging structure is required to be highly transparent. However, the surface of the upper cover substrate becomes rough, and the transparency of the upper cover substrate is affected if a grinding process or an etching process is applied to thin the upper cover substrate, and the process is complex and costly. In addition, by removing the upper cover substrate, the thickness of the packaging structure is reduced, but the performance of the packaging structure is affected.

In an embodiment of the present disclosure, a two-layered substrate formed by attaching a first substrate with a second substrate is used as an upper cover substrate of a packaging structure. The first substrate with a great thickness is removed after the packaging structure is formed, to reduce the thickness of the packaging structure, and the second substrate can still protect devices, such that the performance of the packaging structure is not affected.

To make the above object, features and advantages of the present disclosure more apparent and easier to be understood, particular embodiments of the disclosure are illustrated in detail in conjunction with the drawings hereinafter.

Figure 1:
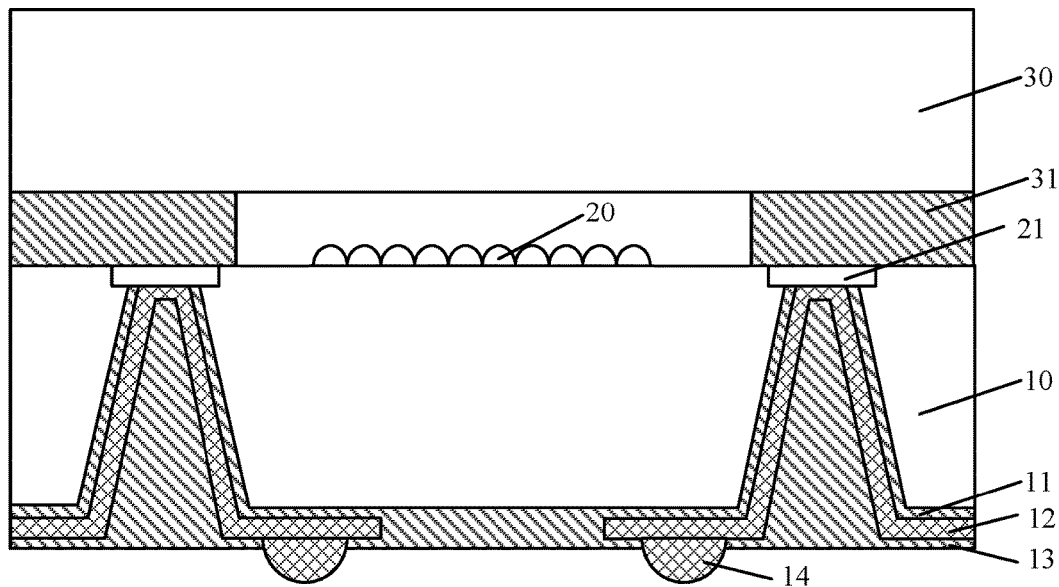
FIGS. 1 to 2 are schematic cross-sectional structural diagrams of a packaging structure according to the conventional technology.
Figure 2:
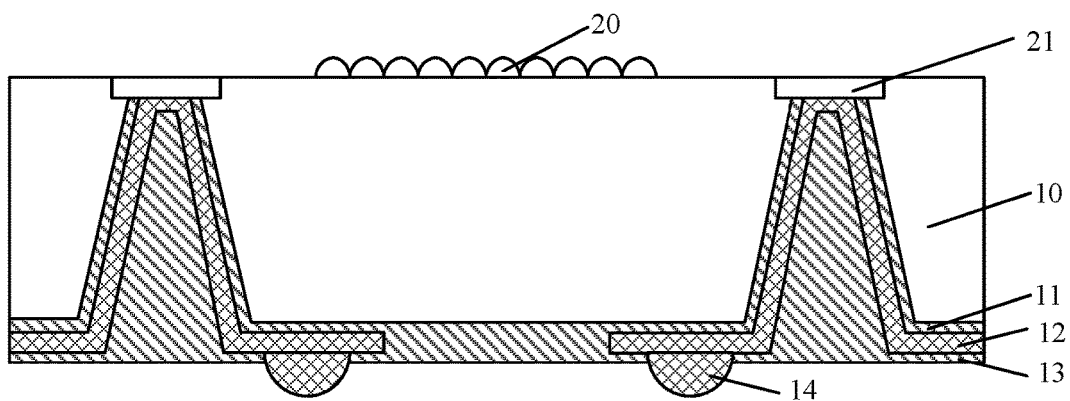
Figure 3:
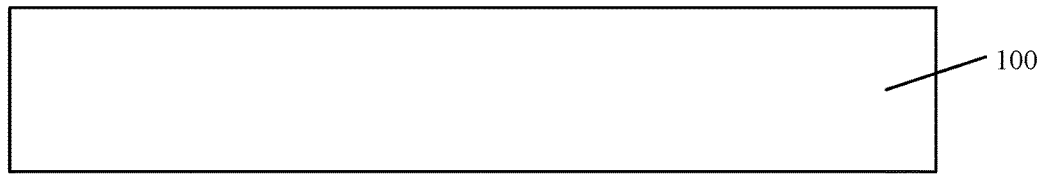
FIGS. 3 to 13 are schematic structural diagrams illustrating a forming procedure of a packaging structure according to the embodiments of the present disclosure.

Referring to FIG. 3, a first substrate 100 is provided.

A material of the first substrate 100 may be grass, a silicon wafer, ceramic or plastic. As a part of the two-layered upper cover substrate of the subsequent packaging structure, the first substrate 100 is used to protect a sensing region on a surface of a subsequently provided base which is to be packaged. The first substrate 100 is made of a hard material with high strength and a high degree of corrosion resistance, thus it can bear stresses applied from the outside and various types of chemical pollution during the subsequent packaging process.

Since the first substrate 100 is not retained in the final packaging structure, both a transparent material and a non-transparent material can be used as the material of the first substrate 100, without affecting the performance of the packaging structure.

In the embodiment, the first substrate 100 has a thickness of 300 μm to 500 μm, which enables the first substrate 100 to have a sufficient thickness and sufficient strength to meet demands of the subsequent process.

Figure 4:
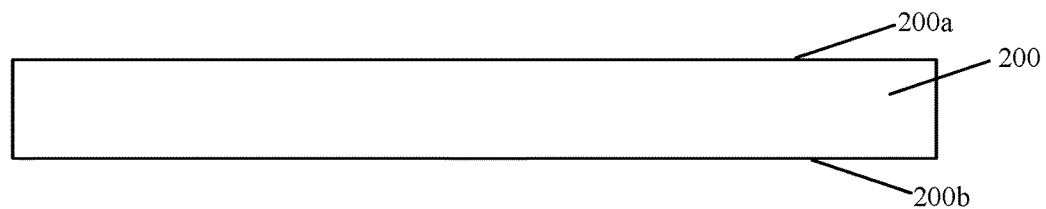

Referring to FIG. 4, a second substrate 200 is provided. The second substrate 200 includes a first surface 200a and a second surface 200b opposite to the first surface 200a.

The second substrate 200 is made of a transparent material which has a high transparency. In addition, surfaces of the second substrate 200 are flat and smooth, thus scattering and diffuse reflection of incident light can be avoided, thereby guaranteeing the high transparency of the second substrate 200.

The subsequently provided base to be packaged includes a sensing region, which is an optical sensing region. The second substrate 200 is retained in the final packaging structure, and is located above the optical sensing region. A transparent material is selected as the material of the second substrate 200, thereby facilitating incidence of light onto the optical sensing region through the second substrate 200.

Specifically, in the embodiment, the material of the second substrate 200 may be inorganic glass or organic glass.

An area and a shape of the second substrate 200 are the same as an area and a shape of the first substrate 100 (as shown in FIG. 4), such that the second substrate 200 and the first substrate 100 are completely overlapped with each other when the second substrate 200 is subsequently attached with the first substrate 100.

The second substrate 200 has a thickness of 100 μm to 200 μm. Since the second substrate 200 is retained in the final packaging structure, the thickness of the second substrate 200 cannot be too great, otherwise the thickness of the packaging structure cannot meet the demand for thin electronic products. Meanwhile, the thickness of the second substrate 200 cannot be too small, since if the thickness of the second substrate 200 is less than 100 μm, the strength of the second substrate 200 is decreased, and the exterior stress that can be borne by the second substrate 200 is decreased. Therefore, the second substrate 200 is prone to breaking and cannot provide sufficient protection to the sensing region in the packaging structure, which makes the packaging structure prone to failure.

The second substrate 200 has two surfaces, and any one of the two surfaces may be selected as the first surface 200a, and correspondingly, a surface opposite to the first surface 200a is used as the second surface 200b.

Subsequently, the second substrate 200 is attached with the first substrate 100 (as shown in FIG. 3) with an adhesive layer to form a two-layered upper cover substrate.

Figure 5:
Figure 6:
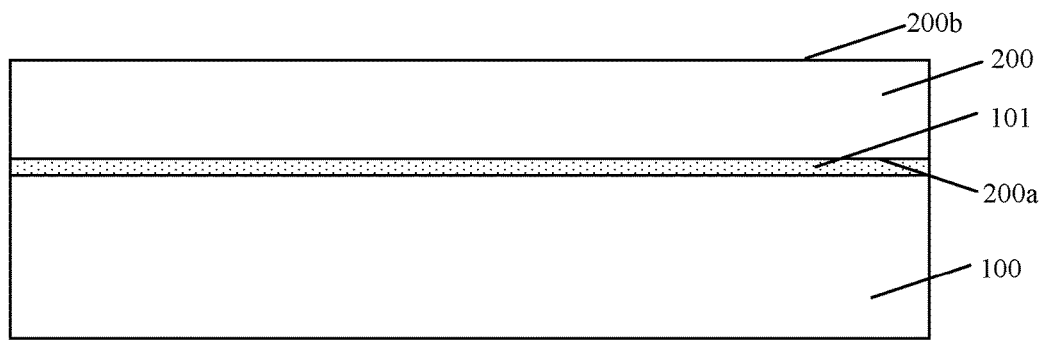

Reference is made to FIGS. 5 and 6, which are structural schematic diagrams illustrating attaching the second substrate 200 (as shown in FIG. 4) with the first substrate 100 (as shown in FIG. 3) with the adhesive layer.

Referring to FIG. 5, an adhesive layer 101 is formed on either surface of the first substrate 100.

The adhesive layer 101 may be formed on either surface of the first substrate 100. The adhesive layer 101 has adhesiveness and is used to attach the first substrate 100 with the subsequently provided second substrate, to form the two-layered upper cover substrate structure.

A material of the adhesive layer 101 may be a polymeric material, such as epoxy resin, polyimide resin, benzocyclobutene resin, polybenzoxazole resin, polybutylene terephthalate, polycarbonate, polyethylene terephthalate, polyethylene, polypropylene, polyolefin, urethane, polyolefin, polyethersulfone, polyamide, polyurethane, or polyvinyl alcohol.

The adhesive layer 101 may be formed on the surface of the first substrate 100 by a spraying process, a spin coating process or an adhesion process, to enable the adhesive layer 101 to have a uniform thickness and a smooth surface.

For the convenience that, in the subsequent process, the first substrate 100 can be attached with the second substrate to form the two-layered upper cover substrate, and the first substrate 100 can be smoothly removed from the second substrate after the packaging is completed, the adhesive layer 101 may be a thermally decomposable adhesive layer. By heating the adhesive layer 101 in the subsequent process, the material of the adhesive layer 101 decomposes, such that the adhesive layer 101 loses adhesiveness, and the first substrate 101 is detached.

Referring to FIG. 6, either surface of the first substrate 100 is attached with the first surface 200a of the second substrate 200 with the adhesive layer 101.

In the embodiment, the first surface 200a of the second substrate 200 is attached with the adhesive layer 101 on the surface of the first substrate 100, such that the first substrate 100 and the second substrate 200 are attached together to form the upper cover substrate with a two-layered structure. In addition, since the first substrate 100 is attached with the second substrate 200 with the adhesive layer 101, the first substrate 100 can be easily separated from the second substrate 200 in the subsequent process.

By attaching the first substrate 100 and the second substrate 200 together to form the upper cover substrate with the two-layered structure, the upper cover substrate can have a sufficient thickness to meet the demands for the thickness and the strength of the upper cover substrate in the subsequent packaging process.

In other embodiments of the present disclosure, the adhesive layer 101 may also be formed on the first surface 200a of the second substrate 200, and then the first surface 200a of the second substrate 200 is attached with either surface of the first substrate 100, such that the first substrate 100 is attached with the second substrate 200 with the adhesive layer 101 to form the two-layered upper cover substrate.

In another embodiment of the present disclosure, another method for attaching the second substrate with the first substrate with the adhesive layer to form the two-layered upper cover substrate is provided. The method includes: forming a first adhesive layer on either surface of the first substrate 100 (as shown in FIG. 3) and forming a second adhesive layer on the first surface 200a (as shown in FIG. 4) of the second substrate 200 (as shown in FIG. 4), or forming the second adhesive layer on either surface of the first substrate 100 and forming the first adhesive layer on the first surface 200a of the second substrate 200; and attaching the first substrate 100 with the second substrate 200 with the first adhesive layer and the second adhesive layer. The first adhesive layer and the second adhesive layer form the adhesive layer for attaching the first substrate 100 with the second substrate 200.

A material of each of the first adhesive layer and the second adhesive layer may be a polymeric material, such as epoxy resin, polyimide resin, benzocyclobutene resin, polybenzoxazole resin, polybutylene terephthalate, polycarbonate, polyethylene terephthalate, polyethylene, polypropylene, polyolefin, urethane, polyolefin, polyethersulfone, polyamide, polyurethane, or polyvinyl alcohol. The first adhesive layer and the second adhesive layer may be formed by a spraying process, a spin coating process or an adhesion process.

To facilitate subsequent separation of the first substrate 100 from the second substrate 200, the first adhesive layer of the adhesive layer may be an adhesive layer which is decomposable under laser irradiation, while the second adhesive layer may be made of any polymeric material having adhesiveness. In the subsequent process, the first adhesive layer is irradiated with laser and decomposes thereby losing adhesiveness, such that the first substrate 100 is separated from the second substrate 200.

A greater thickness of the first adhesive layer requires a higher laser power to be used for processing the adhesive layer with the laser irradiation decomposition method in the subsequent process. In this case, the quantity of heat generated by laser irradiation is increased, such that the efficiency of decomposition is reduced, and excessive heat may affect the performances of the first substrate and the second substrate on two sides of the adhesive layer. To avoid the above problem, a first adhesive layer with a low thickness may be adopted, for example, the thickness of the first adhesive layer may be less than 3 microns. Specifically, the thickness of the first adhesive layer may be 0.2 microns to 0.9 microns, or 1.1 microns to 2 microns.

In a case where the first adhesive layer has a smaller thickness and low adhesiveness, a second adhesive layer is needed to increase the total thickness of the adhesive layer when the first substrate 100 is attached with the second substrate 200, thereby increasing the adhesiveness of the adhesive layer, to avoid separation of the first substrate 100 from the second substrate 200 in the subsequent packaging process.

In other embodiments of the present disclosure, both the first adhesive layer and the second adhesive layer may be thermally decomposable adhesive layers. The first adhesive layer and the second adhesive layer may be subsequently heated such that the first adhesive layer and the second adhesive layer lose adhesiveness.

Figure 7:
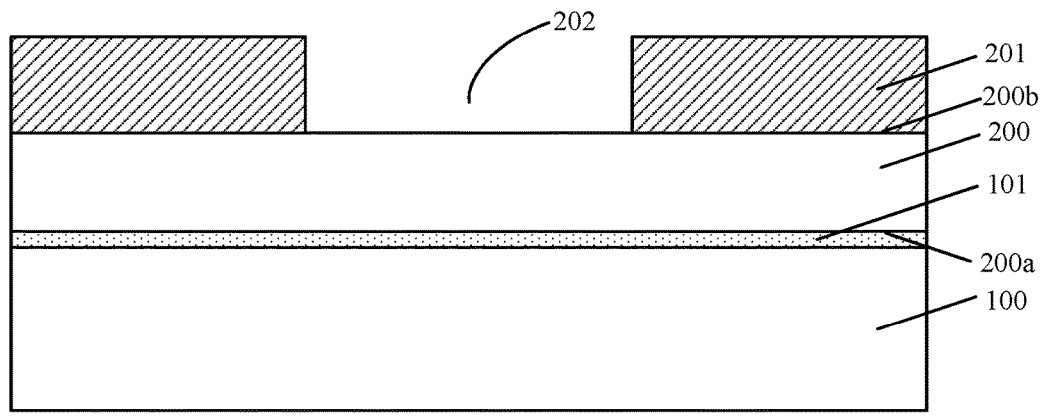

Referring to FIG. 7, a groove structure is formed on the second surface 200b of the second substrate 200.

In the embodiment, the groove structure includes: a cavity wall material layer 201 on the second surface 200b of the second substrate 200; and a groove 202 in the cavity wall material layer 201.

Specifically, in the embodiment, a method for forming the groove structure includes: forming a complete cavity wall material layer 201 on the second surface of the second substrate 200, etching the cavity wall material layer 201 to the surface of the second substrate 200 to form a groove 202 in the cavity wall material layer 201. The position of the groove structure corresponds to the position of the sensing region on the subsequently provided base. The depth of the groove 202 is greater than the height of a device in the sensing region on the subsequently provided base.

In the embodiment, the material of the cavity wall material layer 201 may be a photoresist. The cavity wall material layer 201 may be formed on the second surface 200b of the second substrate 200 by a spraying process, a spin coating process or an adhesion process. Then, the cavity wall material layer 201 is exposed and developed to form the groove 202.

In other embodiments of the present disclosure, the material of the cavity wall material layer 201 may also be an insulation medium material such as silicon oxide, silicon nitride, and silicon oxynitride. The cavity wall material layer 201 may be formed by a deposition process. Then, dry etching is performed on the cavity wall material layer 201 form the groove 202 in the cavity wall material layer 201.

In other embodiments of the present disclosure, the groove structure may include a groove in the second surface 200b of the second substrate 200. Specifically, a method for forming the groove structure includes: etching the second surface 200b of the second substrate 200, to form a groove in the second substrate 200. A dry etching process may be applied to etch the second substrate 200 to form the groove.

Figure 8:
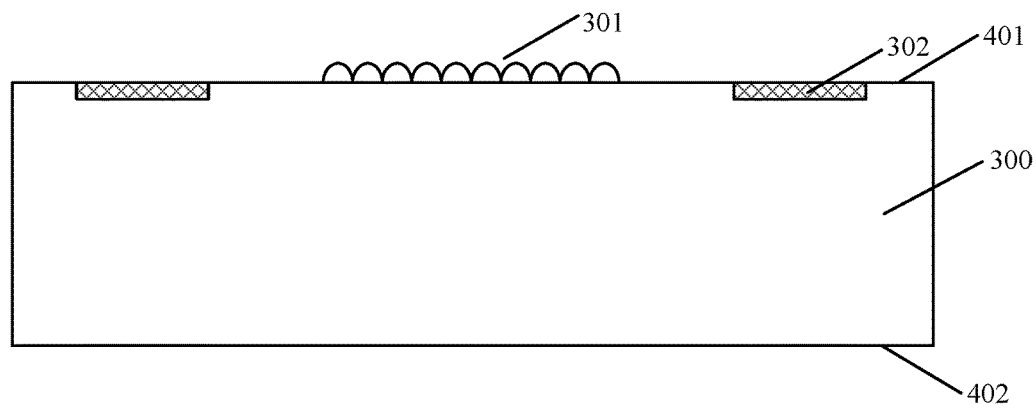

Referring to FIG. 8, a base 300 is provided. The base 300 includes a first surface 401 and a second surface 402 opposite to the first surface 401. The first surface 401 of the base 300 is provided with a sensing region 301 and multiple contact pads 302 located around the sensing region 301.

In the embodiment, the base 300 is a wafer, and includes the sensing region 301 on the first surface 401, the multiple contact pads 302 discretely arranged around the sensing region 301, a functional region (not shown) and a silicon substrate. The sensing region 301 is an optical sensing region, and the contact pads 302 serve as input/output terminals for connecting a device in the sensing region 301 to an external circuit.

FIG. 8 is a schematic cross-sectional diagram of a base including one sensing region.

In other embodiments of the present disclosure, the base 300 may include multiple units. A sensing region 301 and multiple contact pads 302 located around the sensing region 301 are formed on each of the multiple units. Sawing lanes are provided between adjacent units, so that the cutting process is performed after the packaging is completed to form multiple chip packages.

Figure 9:
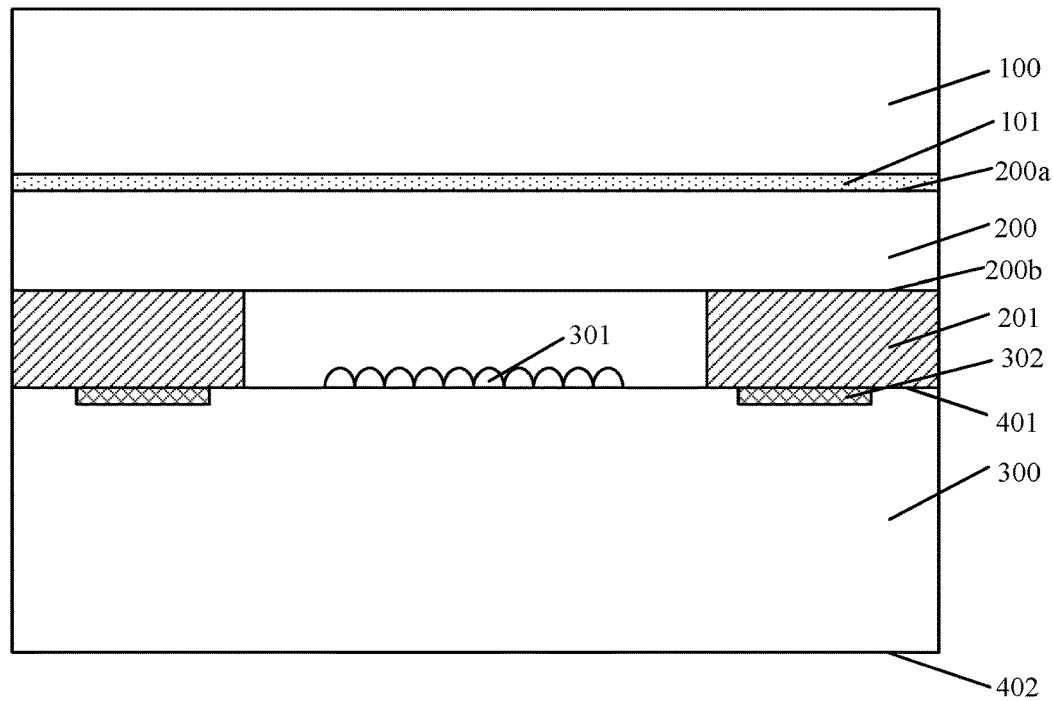

Referring to FIG. 9, the second surface 200b of the second substrate 200 is attached with the first surface 401 of the base 300. A cavity is formed between the groove 202 (as shown in FIG. 8) and the base 300, and the sensing region 301 is located in the cavity.

In the embodiment, an adhesive layer is formed on a surface of the cavity wall material layer 201 on the second surface 200b of the second substrate 200 and is attached with the base 300. The adhesive layer may be made of a polymeric adhesive material, such as silica gel, epoxy resin, benzocyclobutene and other polymeric materials, and formed by a spraying process, a spin coating process or an adhesion process. The adhesive layer performs an attaching function as well as an insulating and sealing function.

The second surface 200b of the second substrate 200 is attached with the first surface 401 of the base 300. A cavity is formed between the cavity wall material layer 201, the second substrate 200 and the base 300. The position of the cavity corresponds to the sensing region 301 formed on the first surface 401 of the base 300, such that the sensing region 301 is located in the cavity, while the contact pads 302 around the sensing region 301 are located outside the cavity and between the base 300 and the cavity wall material layer 201.

Since the sensing region 301 is located in the cavity, the sensing region 301 is protected by the first substrate 100, the second substrate 200 and the cavity wall material layer 201 on two sides in the subsequent packaging process, thus damage and pollution to the sensing region 301 can be avoided.

In other embodiments of the present disclosure, the groove is provided in the second substrate 200. An adhesive layer may be formed on a surface of the second substrate 200 in which the groove is provided, and the surface of the second substrate 200 in which the groove is provided is attached with the first surface 401 of the base 300, such that a cavity is formed between the second substrate 200 and the base 300, and the sensing region 301 is located in the cavity.

After the second surface 200b of the second substrate 200 is attached with the first surface 401 of the base 300, the packaging process is performed on the second surface 402 of the base 300.

Figure 10:
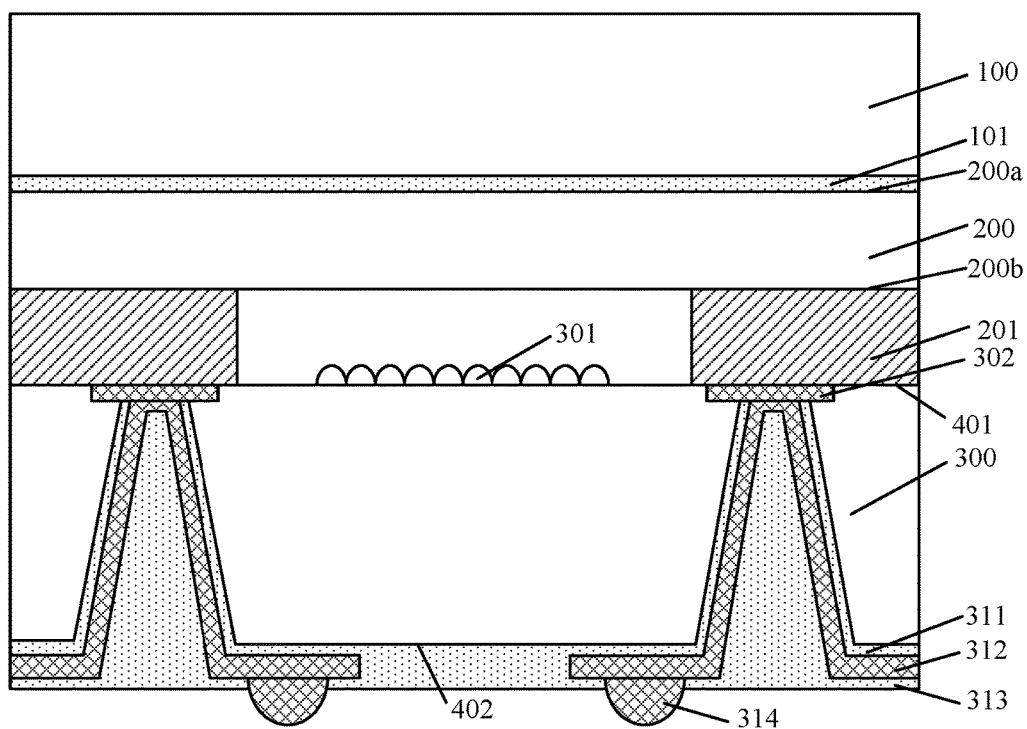

Reference is made to FIG. 10, which shows an embodiment of performing the packaging process on the second surface 402 of the base 300. The packaging process of the embodiment includes the following steps.

First, the second surface 402 of the base 300 is thinned to reduce the thickness of the base 300. An etching process or a chemical-mechanical grinding process may be applied to perform the thinning, to facilitate subsequent formation of through hole in the base 300.

Then, the second surface 402 of the base 300 is etched to form the through hole in the base 300. A part of the surface of the contact pad 302 is exposed at the bottom of the through hole, and the through hole is used to form a metal connection structure for connection to the contact pad.

An insulation layer 311 is formed on the second surface 402 of the base 300 and a sidewall surface of the through hole. The material of the insulation layer 311 may be an insulation medium material such as silicon oxide and silicon nitride. The insulation layer 311 is used to insulate the base 300 from a subsequently formed metal layer. Then, a metal layer 312 connected with the contact pad 302 is formed on a surface of the insulation layer 311. The metal layer 312 is electrically connected with the contact pad 302.

A solder mask 313 with openings is formed on a surface of the metal layer 312 and the surface of the insulation layer 311. The material of the solder mask 313 may be an insulation medium material such as silicon oxide and silicon nitride. The solder mask 313 is used to protect the metal layer 312. A part of the surface of the metal layer 312 is exposed by the openings, to facilitate subsequent formation of solder joints on the metal layer 312.

A protrusion for external connection 314 is formed on the surface of the metal layer 312. The protrusion for external connection 314 may be a connection structure such as a solder ball and a metal pillar, and may be made of a metal material such as copper, aluminum, gold, tin or lead.

Figure 11:
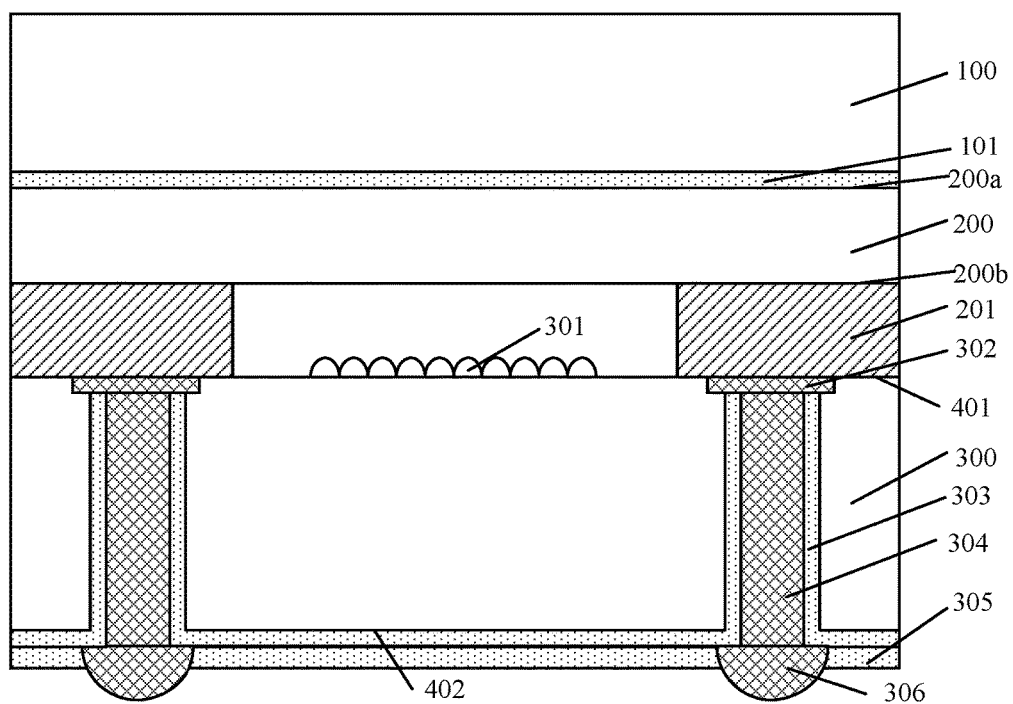

Reference is made to FIG. 11, which shows another embodiment of performing the packaging process on the second surface 402 of the base 300. The packaging process includes: thinning the second surface 402 of the base 300, and then etching the second surface 402 of the base 300 to form a through hole in the base 300, where a part of a surface of the contact pad 302 is exposed at a bottom of the through hole; forming an insulation layer 303 on the second surface 402 of the base 300 and a sidewall surface of the through hole; forming a metal layer 304 which is connected with the contact pad 302 on a surface of the insulation layer 303, where the through hole is filled with the metal layer 304, and a surface of the metal layer is flush with the surface of the insulation layer 303; forming a solder mask 305 having an opening on the surface of the metal layer 304 and the surface of the insulation layer 303, where the top surface of the metal layer 304 is exposed by the openings in the solder mask 305; and forming a protrusion for external connection 306 which is connected with the top surface of the metal layer 304 in the opening, where the protrusion for external connection 306 may be a connection structure such as a solder ball and a metal pillar, and may be made of a metal material such as copper, aluminum, gold, tin, and lead.

Figure 12:
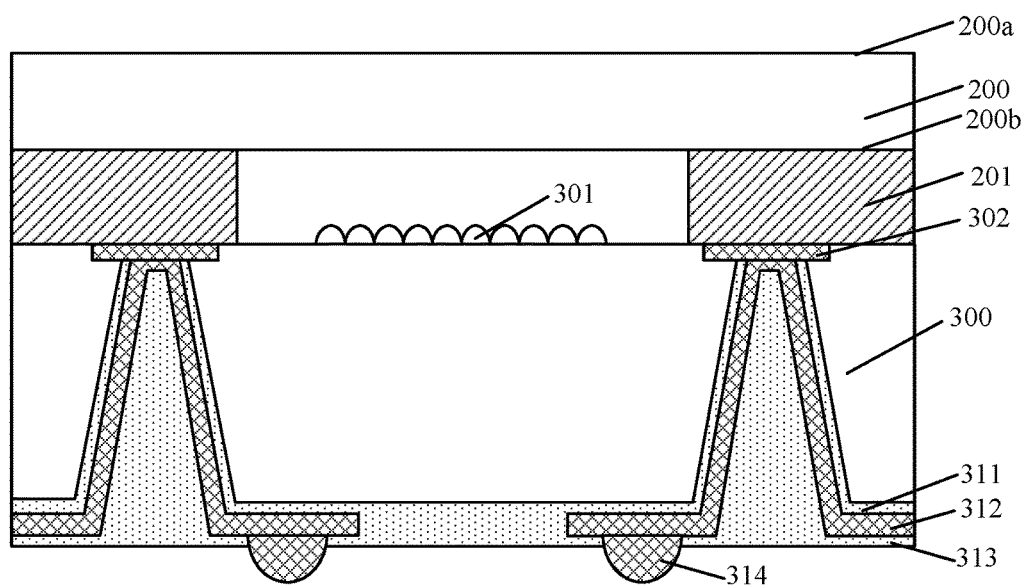
Figure 13:
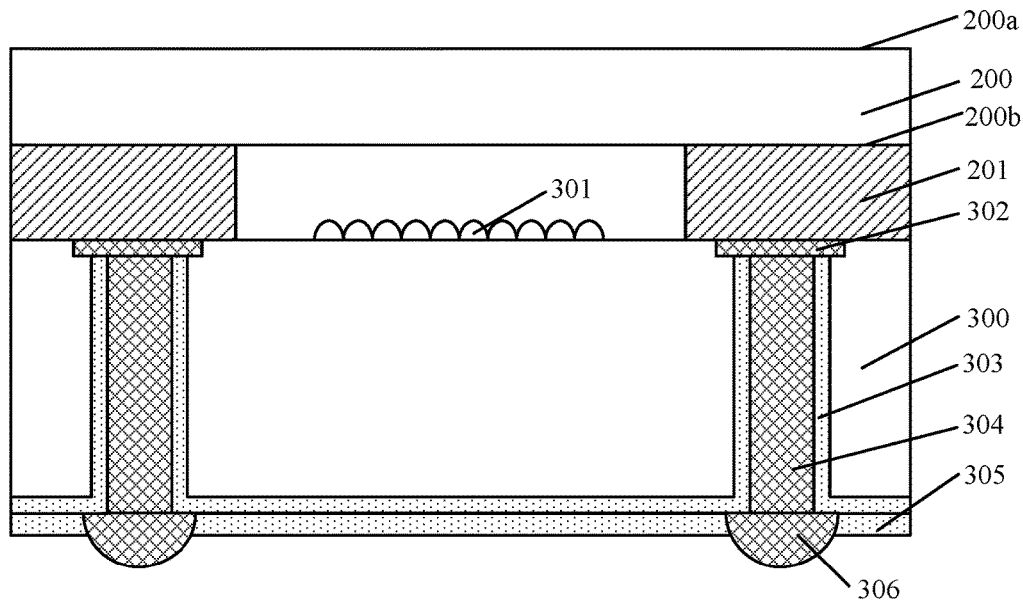

Referring to FIGS. 12 and 13, the first substrate 100 (as shown in FIGS. 10 and 11) and the adhesive layer 101 (as shown in FIG. 10-11) are removed. FIGS. 12 and 13 respectively corresponds to structures formed with the packaging process in the above two embodiments.

A packaging structure is formed after performing the packaging process on the second surface 402 of the base 300. Since the upper cover substrate on the first surface 401 of the base 300 of the packaging structure has a great thickness, by removing the first substrate 100, the thickness of the upper cover substrate on the first surface 401 of the base 300 may be reduced, and the retained second substrate 200 can still protect the sensing region 301 on the base 300.

In the embodiment, the adhesive layer 101 between the first substrate 100 and the second substrate 200 is a thermally decomposable adhesive layer. The material of the adhesive layer 101 decomposes when heated and loses adhesiveness. Therefore, in this embodiment, the adhesive layer 101 is heated to cause the adhesive layer 101 to lose adhesiveness, such that the first substrate 100 is detached from the surface of the adhesive layer 101 and removed. The heating temperature is lower than the melting point of the protrusion for external connection 314, such that the performance of the packaging structure is not affected.

In other embodiments of the present disclosure, the adhesive layer between the first substrate 100 and the second substrate 200 includes a first adhesive layer and a second adhesive layer. The first adhesive layer is an adhesive layer which is decomposable under laser irradiation. The first adhesive layer is irradiated using laser such that the material of the first adhesive layer decomposes and loses adhesiveness. Specifically, yttrium aluminum garnet laser with a wave length of 1064 nm and an output power of 15 W to 40 W may be used for irradiation. In other embodiments of the present disclosure, laser with other wave lengths such as an ultraviolet wavelength may also be used for irradiation.

In other embodiments of the present disclosure, the adhesive layer 101 includes a first adhesive layer and a second adhesive layer, and both the first adhesive layer and the second adhesive layer are thermally decomposable adhesive layers. The first adhesive layer and the second adhesive layer may be heated to cause both the first adhesive layer and the second adhesive layer to lose adhesiveness, such that the first substrate 100 is detached from the second substrate 200.

If the first substrate 100 is removed by a wet etching process or a dry etching process, materials of other portions as well as devices of the packaging structure are easily affected. By using the method described above, the affection may be avoided.

After the first substrate 100 is removed, the surface of the second substrate 200 may be cleaned to remove the adhesive layer 101 remained on the surface of second substrate 200 and expose the surface of to second substrate 200. The cleaning agent used for cleaning does not corrode the second substrate 200, thus the smoothness and translucency of the surface of the second substrate is not affected.

Since the first substrate 100 has a great thickness, the thickness of the formed packaging structure is reduced when the first substrate 100 is removed, and the retained second substrate 200 can still protect the sensing region, thereby ensuring that the performance of the packaging structure is not affected by outside factors.

In summary, in the embodiments of the present disclosure, a first substrate is attached with a second substrate with an adhesive layer, then a groove structure is formed on a second surface of the second substrate or inside the second substrate, and the second surface of the second substrate is attached with a first surface of a base. A cavity is formed between the groove structure and the base, so that a sensing region on the surface of the base is located in the cavity. The first substrate and the second substrate constitute a two-layered upper cover substrate, which is attached with the base and is capable of protecting the sensing region on the base during the subsequent packaging process. In addition, the upper cover substrate has a two-layered structure, which facilitates subsequent removing of the first substrate to reduce the thickness of the formed packaging structure.

In other embodiments of the present disclosure, a packaging structure formed using the above method is further provided.

Referring to FIGS. 10 and 11, the packaging structure includes: a first substrate 100 and a second substrate 200, where the second substrate 200 includes a first surface 200a and a second surface 200b opposite to the first surface 200a, and either surface of the first substrate 100 is attached with the first surface 200a of the second substrate 200 with an adhesive layer 101; a groove structure located on the second surface 200b of the second substrate 200; and a base 300, where the base 300 includes a first surface 401 and a second surface 402 opposite to the first surface 401, and a sensing region 301 and multiple contact pads 302 located around the sensing region 301 are formed on the first surface 401 of the base 300, where the second surface 200b of the second substrate 200 is attached with the first surface 401 of the base 300, a cavity is formed between the groove structure and the base 300, and the sensing region 301 is located in the cavity.

A material of the first substrate 100 may be grass, a silicon wafer, ceramic or plastic. As a part of a two-layered upper cover substrate of the packaging structure, the first substrate 100 is used to protect the sensing region on the surface of the base. Therefore, the material of the first substrate 100 is required to be a hard material with high strength and a high degree of corrosion resistance for bearing stresses applied from the outside and various types of chemical pollution.

In the embodiment, the first substrate 100 has a thickness of 300 μm to 500 μm, which enables the first substrate 100 to have a sufficient thickness and sufficient strength to meet demands of the subsequent process.

The second substrate 200 is made of a transparent material which has a high transparency. In addition, surfaces of the second substrate 200 are flat and smooth, thus scattering and diffuse reflection of incident light can be avoided, thereby guaranteeing the high transparency of the second substrate 200. The base includes a sensing region, which is an optical sensing region. The second substrate 200 is retained in the final packaging structure, and is located above the optical sensing region. Therefore, it is necessary to select a transparent material as the material of the second substrate 200, thereby facilitating incidence of light onto the optical sensing region through the second substrate 200.

Specifically, in the embodiment, the material of the second substrate 200 may be inorganic glass or organic glass.

An area and a shape of the second substrate 200 are the same as an area and a shape of the first substrate 100, such that the second substrate 200 and the first substrate 100 are completely overlapped with each other.

The second substrate 200 has a thickness of 100 µm to 200 µm. Since the second substrate 200 is retained in the final packaging structure, the thickness of the second substrate 200 cannot be too great, otherwise the thickness of the packaging structure cannot meet the demand for thin electronic products. Meanwhile, the thickness of the second substrate 200 cannot be too small, since if the thickness of the second substrate 200 is less than 100 µm, the strength of the second substrate 200 is decreased, and the exterior stress that can be borne by the second substrate 200 is decreased. Therefore, the second substrate 200 is prone to breaking and cannot provide sufficient protection to the sensing region in the packaging structure, which makes the packaging structure prone to failure.

The second substrate 200 has two surfaces, and any one of the two surfaces may be selected as the first surface 200a, and correspondingly, a surface opposite to the first surface 200a is used as the second surface 200b.

The first surface 200a of the second substrate 200 is attached with either surface of the first substrate 100 with an adhesive layer 101. The adhesive layer 101 has adhesiveness. A material of the adhesive layer 101 may be a polymeric material such as epoxy resin, polyimide resin, benzocyclobutene resin, polybenzoxazole resin, polybutylene terephthalate, polycarbonate, polyethylene terephthalate, polyethylene, polypropylene, polyolefin, urethane, polyolefin, polyethersulfone, polyamide, polyurethane, or polyvinyl alcohol.

In the embodiment, the adhesive layer 101 may be a thermally decomposable adhesive layer. By heating the adhesive layer 101 in the subsequent process, the material of the adhesive layer 101 decomposes, such that the adhesive layer 101 loses adhesiveness, and the first substrate 101 is detached.

In other embodiments of the present disclosure, the adhesive layer 101 may also include a first adhesive layer and a second adhesive layer. In an embodiment of the present disclosure, the first adhesive layer is located on the surface of the first substrate 100, and the second adhesive layer is located on the first surface 200a of the second substrate 200. In another embodiment of the present disclosure, the second adhesive layer is located on the surface of the first substrate 100, and the first adhesive layer is located on the first surface 200a of the second substrate 200.

A material of each of the first adhesive layer and the second adhesive layer may be a polymeric material, such as epoxy resin, polyimide resin, benzocyclobutene resin, polybenzoxazole resin, polybutylene terephthalate, polycarbonate, polyethylene terephthalate, polyethylene, polypropylene, polyolefin, urethane, polyolefin, polyethersulfone, polyamide, polyurethane, or polyvinyl alcohol.

The first adhesive layer of the adhesive layer 101 may be an adhesive layer which is decomposable under laser irradiation, while the second adhesive layer may be made of any polymeric material having adhesiveness. The first adhesive layer decomposes and loses adhesiveness when irradiated with laser, such that the first substrate 100 is separated from the second substrate 200. The thickness of the first adhesive layer is less than 3 microns. Specifically, the thickness of the first adhesive layer may be 0.2 microns to 0.9 microns, or 1.1 microns to 2 microns.

In other embodiments of the present disclosure, both the first adhesive layer and the second adhesive layer may be thermally decomposable adhesive layers. The first adhesive layer and the second adhesive layer may be subsequently heated such that the first adhesive layer and the second adhesive layer lose adhesiveness.

In the embodiment, the groove structure includes: a cavity wall material layer 201 on the second surface 200b of the second substrate 200; and a groove 202 in the cavity wall material layer 201. A material of the cavity wall material layer 201 is a photoresist, and also may be an insulation medium material such as silicon oxide, silicon nitride, and silicon oxynitride.

In other embodiments of the present disclosure, the groove structure may include a groove in a surface of the second substrate 200 which is not attached with the first substrate 100.

In the embodiment, the base 300 is a wafer, and includes the sensing region 301 on the first surface 401, the multiple contact pads 302 discretely arranged around the sensing region 301, a functional region (not shown) and a silicon substrate. The sensing region 301 is an optical sensing region, and the contact pads 302 serve as input/output terminals for connecting a device in the sensing region 301 to an external circuit.

In other embodiments of the present disclosure, the base 300 may include multiple units. A sensing region 301 and multiple contact pads 302 located around the sensing region 301 are formed on each of the multiple units. Sawing lanes are provided between adjacent units, to facilitate the cutting process for forming multiple chip packages. A groove structure located at the second surface of the second substrate is provided with multiple grooves, which respectively correspond to the multiple sensing regions on the multiple units.

The second surface 200b of the second substrate 200 is attached with the first surface 401 of the base 300. A cavity is formed between the cavity wall material layer 201, the second substrate 200 and the base 300. The position of the cavity corresponds to the sensing region 301 formed on the first surface 401 of the base 300, such that the sensing region 301 is located in the cavity, while the contact pads 302 around the sensing region 301 are located outside the cavity and between the base 300 and the cavity wall material layer 201. The sensing region 301 is protected by the first substrate 100, the second substrate 200 and the cavity wall material layer 201 on two sides, thus damage and pollution to the sensing region 301 can be avoided.

Referring to FIG. 10, in the embodiment, the packaging structure further includes: a through hole in the second surface 402 of the base 300, where a part of a surface of the contact pad 302 is exposed at a bottom of the through hole; an insulation layer 311 formed on the second surface 402 of the base 300 and a sidewall surface of the through hole; a metal layer 312 which is located on a surface of the insulation layer 311 and is connected with the contact pad 302; a solder mask 313 having an opening formed on a surface of the metal layer 312 and the surface of the insulation layer 311, where a part of the surface of the metal layer 312 is exposed by the opening; and a protrusion for external connection 314 located on the surface of the metal layer 312, where the protrusion for external connection may be a connection structure such as a solder ball and a metal pillar, and may be made of a metal material such as copper, aluminum, gold, tin, and lead.

Referring to FIG. 11, in another embodiment of the present disclosure, the packaging structure further includes: a through hole in the second surface 402 of the base 300, where a part of a surface of the contact pad 302 is exposed at a bottom of the through hole; an insulation layer 303 formed on the second surface 402 of the base 300 and a sidewall surface of the through hole; a metal layer 304 which is formed on a surface of the insulation layer 303 and is connected with the contact pad 302, where the through hole is filled with the metal layer 304, and the surface of the metal layer is flush with the surface of the insulation layer 303; the top surface of the metal layer 304 is exposed by an opening in the solder mask 305; and a protrusion for external connection 306 is formed in the opening and is connected with the top surface of the metal layer 304, where the protrusion for external connection may be a connection structure such as a solder ball and a metal pillar, and may be made of a metal material such as copper, aluminum, gold, tin, and lead.

Another packaging structure formed using the above method is further provided according to an embodiment of the present disclosure.

Referring to FIGS. 12 to 13, the packaging structure includes: a second substrate 200, where the second substrate 200 includes a first surface 200a and a second surface 200b opposite to the first surface 200a, and the second substrate has a thickness of 100 μm to 200 μm; a groove structure located at the second surface 200b of the second substrate 200; and a base 300, where the base 300 includes a first surface 401 and a second surface 402 opposite to the first surface 401, and the first surface of the base 401 is provided with a sensing region 301 and multiple contact pads 302 located around the sensing region 301, where the second surface 200b of the second substrate 200 is attached with the first surface 401 of the base 300, and a cavity is formed between the groove structure and the base 300, so that the sensing region 301 is located in the cavity.

The second substrate 200 is made of a transparent material which has a high transparency. In addition, surfaces of the second substrate 200 are flat and smooth, thus scattering and diffuse reflection of incident light can be avoided, thereby guaranteeing the high transparency of the second substrate 200. The material of the second substrate 200 may be inorganic glass or organic glass.

The second substrate 200 has a thickness of 100 μm to 200 μm, which is small, such that the thickness of the packaging structure is small as well and can meet the demand for thin electronic products. However, the thickness of the second substrate 200 cannot be too small, since if the thickness of the second substrate 200 is less than 100 μm, the strength of the second substrate 200 is decreased, and the exterior stress that can be borne by the second substrate 200 is decreased. Therefore, the second substrate 200 is prone to breaking and cannot provide sufficient protection to the sensing region in the packaging structure, which makes the packaging structure prone to failure.

In the embodiment, the groove structure includes: a cavity wall material layer 201 on the second surface 200b of the second substrate 200; and a groove 202 in the cavity wall material layer 201. The material of the cavity wall material layer 201 is photoresist, and also may be an insulation medium material such as silicon oxide, silicon nitride, and silicon oxynitride. In other embodiments of the present disclosure, the groove structure may also include a groove located in the second surface 200b of the second substrate 200.

In the embodiment, the base 300 is a wafer, and includes the sensing region 301 on the first surface 401, the multiple contact pads 302 discretely arranged around the sensing region 301, a functional region (not shown) and a silicon substrate. The sensing region 301 is an optical sensing region, and the contact pads 302 serve as input/output terminals for connecting a device in the sensing region 301 to an external circuit.

In other embodiments of the present disclosure, the base 300 may include multiple units. A sensing region 301 and multiple contact pads 302 located around the sensing region 301 are formed on each of the multiple units. Sawing lanes are provided between adjacent units, to facilitate the cutting process for forming multiple chip packages. A groove structure located at the second surface 200b of the second substrate 200 is provided with multiple grooves, which respectively correspond to the multiple sensing regions on the multiple units.

The second surface 200b of the second substrate 200 is attached with the first surface 401 of the base 300. A cavity is formed between the cavity wall material layer 201, the second substrate 200 and the base 300. The position of the cavity corresponds to the sensing region 301 formed on the first surface 401 of the second substrate 200, such that the sensing region 301 is located in the cavity, while contact pads 302 around the sensing region 301 are located outside cavity and between the base 300 and the cavity wall material layer 201. The sensing region 301 is protected by the second substrate 200 and the cavity wall material layer 201 on two sides, thus damage and pollution to the sensing region 301 can be avoided.

Referring to FIG. 12, in an embodiment of the present disclosure, the packaging structure further includes: a through hole in the second surface 402 of the base 300, where a part of a surface of the contact pad 302 is exposed at a bottom of the through hole; an insulation layer 311 formed on the second surface 402 of the base 300 and a sidewall surface of the through hole; a metal layer 312 which is located on a surface of the insulation layer 311 and is connected with the contact pad 302; a solder mask 313 having an opening formed on a surface of the metal layer 312 and the surface of the insulation layer 311, where a part of the surface of the metal layer 312 is exposed by the opening; and a protrusion for external connection 314 located on the surface of the metal layer 312, where the protrusion for external connection 314 may be a connection structure such as a solder ball and a metal pillar, and may be made of a metal material such as copper, aluminum, gold, tin, and lead.

Referring to FIG. 13, in another embodiment of the present disclosure, the packaging structure further includes: a through hole in the second surface 402 of the base 300, where a part of a surface of the contact pad 302 is exposed at a bottom of the through hole; an insulation layer 303 formed on the second surface 402 of the base 300 and a sidewall surface of the through hole; a metal layer 304 which is formed on a surface of the insulation layer 303 and is connected with the contact pad 302, where the through hole is filled with the metal layer 304, and a surface of the metal layer is flush with the surface of the insulation layer 303; the top surface of the metal layer 304 is exposed by an opening in the solder mask 305; and a protrusion for external connection 306 which is connected with the top surface of the metal layer 304 is formed in the opening, where the protrusion for external connection may be a connection structure such as a solder ball and a metal pillar, and may be made of a metal material such as copper, aluminum, gold, tin, and lead.

The second substrate 200 on the first surface 401 of the base 300 of the packaging structure has a thickness of only 100 μm to 200 μm, which is small, such that the thickness of the packaging structure is small as well and can meet the demand for thin electronic products. In addition, the second substrate 200 can provide sufficient protection to the sensing region 301 on the first surface 401, thus damage and pollution to the sensing region 301 can be avoided.

In the packaging method according to the technical solution of the present disclosure, a surface of a first substrate is attached with a first surface of a second substrate with an adhesive layer, then a groove structure is formed at a second surface of the second substrate, and the second surface of the second substrate is attached with a first surface of a base, a cavity is formed between the groove structure and the base, so that a sensing region on the surface of the base is located in the cavity. The first substrate and the second substrate constitute a two-layered upper cover substrate, which is attached with the base and is capable of protecting the sensing region on the base during the subsequent packaging process. In addition, the upper cover substrate has a two-layered structure, which facilitates subsequent removing of the first substrate to reduce the thickness of the formed packaging structure.

The packaging method further includes: performing a packaging process on the second surface of the base, and removing the first substrate and the adhesive layer to reduce the thickness of the packaging structure. The retained second substrate can still protect the sensing region, thereby ensuring that the performance of the packaging structure is not affected by outside factors. The second substrate has a thickness of 100 μm to 200 μm. Since the second substrate is retained in the final packaging structure, the thickness of the second substrate cannot be too great, otherwise the thickness of the packaging structure cannot meet the demand for thin electronic products. Meanwhile, the thickness of the second substrate cannot be too small, since if the thickness of the second substrate is less than 100 μm, the strength of the second substrate is decreased, and the exterior stress that can be borne by the second substrate is decreased. Therefore, the second substrate is prone to breaking and cannot provide sufficient protection to the sensing region in the packaging structure, which makes the packaging structure prone to failure.

The adhesive layer includes a first adhesive layer and a second adhesive layer. The first adhesive layer is an adhesive layer which is decomposable under laser irradiation. The material of the first adhesive layer decomposes under laser irradiation, thus the first adhesive layer loses adhesiveness. Therefore, the adhesive layer may be irradiated by laser to cause the adhesive layer to lose adhesiveness, such that the first substrate is detached from the surface of the adhesive layer thereby removing the first substrate. By using the above method to remove the first substrate, materials of other portions as well as devices of the packaging structure are protected from being affected.

The adhesive layer may also be a thermally decomposable adhesive layer. The material of the adhesive layer decomposes when heated and thus the adhesive layer loses adhesiveness. Therefore, the adhesive layer may be heated to cause the adhesive layer to lose adhesiveness, such that the first substrate is detached from the surface of the adhesive layer thereby removing the first substrate. By using the above method to remove the first substrate, materials of other portions as well as devices of the packaging structure are protected from being affected.

A packaging structure formed using the above packaging method is further provided according to the embodiments of the present disclosure. The packaging structure includes: a first substrate and a second substrate, where a surface of the first substrate is attached with a first surface of the second substrate with an adhesive layer; and a groove structure located at a second surface of the second substrate, where the second surface of the second substrate is attached with a first surface of a base, a cavity is formed between the groove structure and the base, such that the sensing region on the base is located in the cavity. The two-layered upper cover substrate constituted by the first substrate and the second substrate facilitates subsequent removing of the first substrate to reduce the thickness of the formed package structure. Therefore, it is unnecessary to use an etching or grinding process to reduce the thickness of the upper cover substrate, thus the smoothness of the retained second substrate which is capable of protecting the sensing region can be ensured while the thickness of the package structure can be reduced.

The present disclosure is disclosed above, which is not limited thereto. Various alternations and modifications can be made to the technical solutions of the present disclosure by those skilled in the art without deviation from the spirit and scope of the present disclosure. Therefore, the scope of protection of the present disclosure is defined by the appended claims.

The invention claimed is:

1. A method for forming an image sensor package, comprising:
   providing a first substrate and a second substrate, wherein the second substrate comprises a first surface and a second surface opposite to the first surface, and the second substrate has a thickness of 100 μm to 200 μm;
   attaching either surface of the first substrate with the first surface of the second substrate having a thickness of 100 μm to 200 μm with an adhesive layer;
   forming a groove structure at the second surface of the second substrate after attaching either surface of the first substrate with the first surface of the second substrate having a thickness of 100 μm to 200 μm with the adhesive layer, wherein the forming the groove structure comprises: forming a cavity wall material layer on the second surface of the second substrate, and etching the cavity wall material layer to the surface of the second substrate to form a groove in the cavity wall material layer; or etching the second surface of the second substrate to form a groove in the second substrate;
   providing a base, wherein the base comprises a first surface and a second surface opposite to the first surface, and the first surface of the base is provided with a sensing region and a plurality of contact pads located around the sensing region;
   attaching the second surface of the second substrate with the first surface of the base, wherein a cavity is formed between the groove structure and the base, and the sensing region is located within the cavity; and
   removing the first substrate and the adhesive layer.

2. The method according to claim 1, wherein, after attaching the second surface of the second substrate with the first surface of the base, the method further comprises:
   performing a packaging process on the second surface of the base, wherein the packaging process performed on the second surface of the base comprises:
   thinning and etching the second surface of the base to form a through hole, wherein a part of a surface of the contact pad is exposed at a bottom of the through hole;
   forming an insulation layer on the second surface of the base and a sidewall surface of the through hole;

forming a metal layer on a surface of the insulation layer, wherein the metal layer is connected with the contact pad;

forming a solder mask having an opening on a surface of the metal layer and the surface of the insulation layer, wherein a part of the surface of the metal layer is exposed by the opening; and forming a protrusion for external connection on the surface of the metal layer.

3. The method according to claim 2, wherein the through hole is filled with the metal layer, and the surface of the metal layer is flush with the second surface of the base; the top surface of the metal layer is exposed by the opening in the solder mask; and the protrusion for external connection is formed in the opening, wherein the protrusion for external connection is connected with the top surface of the metal layer.

4. The method according to claim 1, wherein the first substrate has a thickness of 300 μm to 500 μm.

5. The method according to claim 1, wherein the attaching the surface of the first substrate with the first surface of the second substrate with the adhesive layer comprises:

forming the adhesive layer on the surface of the first substrate, and attaching the first surface of the second substrate with the adhesive layer; or forming the adhesive layer on the first surface of the second substrate, and attaching the surface of the first substrate with the adhesive layer.

6. The method according to claim 1, wherein the adhesive layer comprises a first adhesive layer and a second adhesive layer, and the attaching the surface of the first substrate with the first surface of the second substrate having a thickness of 100 μm to 200 μm with the adhesive layer comprises:

forming the first adhesive layer on the surface of the first substrate and forming the second adhesive layer on the first surface of the second substrate, or forming the second adhesive layer on the surface of the first substrate and forming the first adhesive layer on the first surface of the second substrate; and attaching the first substrate with the second substrate with the first adhesive layer and the second adhesive layer.

7. The method according to claim 6, wherein the first adhesive layer is an adhesive layer which is decomposable under laser irradiation, and is irradiated by laser to cause the adhesive layer to lose adhesiveness, to remove the first substrate; or the adhesive layer is a thermally decomposable adhesive layer, and is processed using a thermal decomposition method, to cause the adhesive layer to lose adhesiveness, to remove the first substrate.

8. The method according to claim 2, wherein the surface of the second substrate is cleaned to remove the adhesive layer on the surface of the second substrate.

9. The method according to claim 1, wherein the base comprises a plurality of units, a sensing region and a plurality of contact pads located around the sensing region are formed on each of the plurality of units, sawing lanes are provided between adjacent units, and the groove structure formed on a surface of the second substrate other than the surface attached with the first substrate comprises a plurality of grooves which have a one-to-one correspondence with a plurality of sensing regions on the plurality of units; and the method further comprises:

cutting the base and the second substrate along the sawing lanes after the first substrate and the adhesive layer is removed, to form a plurality of chip packages.

\* \* \* \* \*